(12) United States Patent
Suh et al.

(10) Patent No.: US 10,222,853 B2
(45) Date of Patent: Mar. 5, 2019

(54) POWER SAVING TECHNIQUES FOR MEMORY SYSTEMS BY CONSOLIDATING DATA IN DATA LANES OF A MEMORY BUS

(71) Applicant: QUALCOMM Incorporated, San Diego, CA (US)

(72) Inventors: Jungwon Suh, San Diego, CA (US); Dexter Tamio Chun, San Diego, CA (US); Michael Hawjing Lo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 15/448,327

(22) Filed: Mar. 2, 2017

(65) Prior Publication Data
US 2017/0255394 A1   Sep. 7, 2017

Related U.S. Application Data

(60) Provisional application No. 62/302,891, filed on Mar. 3, 2016.

(51) Int. Cl.
*G06F 1/32* (2006.01)
*G11C 7/10* (2006.01)
(Continued)

(52) U.S. Cl.
CPC .......... *G06F 1/3275* (2013.01); *G06F 1/3225* (2013.01); *G06F 12/06* (2013.01);
(Continued)

(58) Field of Classification Search
CPC .................... G11C 2207/102; G06F 2212/401
See application file for complete search history.

(56) References Cited

U.S. PATENT DOCUMENTS 5,864,510 A * 1/1999 Nakaoka ................ G11C 29/40
365/201
6,009,026 A * 12/1999 Tamlyn .................... G11C 7/10
365/189.07
(Continued)

FOREIGN PATENT DOCUMENTS

WO   2014209399 A1   12/2014
WO   WO-2016186564 A1 * 11/2016 .............. G06F 3/06

OTHER PUBLICATIONS

Chen et al. "C-Pack: A High-Performance Microprocessor Cache Compression Algorithm." Aug. 2010. IEEE. IEEE Transactions on Very Large Scale Integration (VLSI) Systems. vol. 18. pp. 1196-1208.*
(Continued)

*Primary Examiner* — Nathan Sadler
(74) *Attorney, Agent, or Firm* — Withrow & Terranova, PLLC

(57) ABSTRACT

Power saving techniques for memory systems are disclosed. In particular, exemplary aspects of the present disclosure contemplate taking advantage of patterns that may exist within memory elements and eliminating duplicative data transfers. Specifically, if data is repetitive, instead of sending the same data repeatedly, the data may be sent only a single time with instructions that cause the data to be replicated at a receiving end to restore the data to its original repeated state.

26 Claims, 18 Drawing Sheets

(51) Int. Cl.
| | |
|---|---|
| *G06F 12/06* | (2006.01) |
| *G06F 13/16* | (2006.01) |
| *G06F 1/3234* | (2019.01) |
| *G06F 13/42* | (2006.01) |
| *G06F 1/3225* | (2019.01) |

(52) U.S. Cl.
CPC ...... *G06F 13/1668* (2013.01); *G06F 13/1673* (2013.01); *G06F 13/4234* (2013.01); *G11C 7/1006* (2013.01); *G11C 2207/102* (2013.01); *Y02D 10/13* (2018.01); *Y02D 10/14* (2018.01); *Y02D 10/151* (2018.01)

(56) References Cited

U.S. PATENT DOCUMENTS

| | | | | | |
|---|---|---|---|---|---|
| 6,145,069 | A | * | 11/2000 | Dye | H03M 7/30 345/501 |
| 7,190,284 | B1 | * | 3/2007 | Dye | G06F 12/023 341/51 |
| 2006/0004968 | A1 | * | 1/2006 | Vogt | G06F 12/0804 711/154 |
| 2011/0307659 | A1 | * | 12/2011 | Hans | G06F 3/0613 711/114 |
| 2014/0047199 | A1 | * | 2/2014 | Kim | G06F 12/04 711/154 |
| 2014/0068154 | A1 | * | 3/2014 | Hoya | G06F 3/0688 711/103 |
| 2015/0088437 | A1 | * | 3/2015 | Lin | G01R 31/2834 702/58 |
| 2015/0121096 | A1 | * | 4/2015 | Chun | G06F 3/0625 713/320 |
| 2015/0121111 | A1 | * | 4/2015 | Chun | G06F 1/3275 713/324 |
| 2015/0186282 | A1 | | 7/2015 | Rahme et al. | |
| 2015/0186309 | A1 | | 7/2015 | Lee et al. | |
| 2017/0115900 | A1 | * | 4/2017 | Camp | G06F 3/0679 |
| 2018/0143770 | A1 | * | 5/2018 | Arelakis | G06F 3/06 |

OTHER PUBLICATIONS

Ahn et al. "Future Scaling of Processor-Memory Interfaces." Nov. 2009. ACM. SC'09.*
Thuresson et al. "Memory-Link Compression Schemes: A Value Locality Perspective." Jul. 2008. IEEE. IEEE Transactions on Computers. vol. 57. pp. 916-927.*
Ahn et al. "Multicore DIMM: an Energy Efficient Memory Module with Independently Controlled DRAMs." Nov. 2008. IEEE. IEEE Computer Architecture Letters. vol. 8. pp. 5-8.*
Sathish et al. "Lossless and Lossy Memory I/O Link Compression for Improving Performance of GPGPU Workloads." Sep. 2012. ACM. PACT'12. pp. 325-334.*
Kim et al. "Bit-Plane Compression: Transforming Data for Better Compression in Many-core Architectures." Jun. 2016. IEEE. ISCA 2016.*
Dewritech. "Mobile DDR." Feb. 2015. https://en.wikipedia.org/w/index.php?title=Mobile_DDR&oldid=647436496.*
JEDEC. Low Power Double Data Rate 4 (LPDDR4). Aug. 2014. JEDEC. JESD209-4.*
Nunez and Jones. "Gbit/s Lossless Data Compression Hardware." Jun. 2003. IEEE. IEEE Transactions on Very Large Scale Integration (VLSI) Systems. vol. 11. pp. 499-510.*
International Search Report and Written Opinion for PCT/US2017/020582, dated May 12, 2017, 12 pages.
Second Written Opinion for PCT/US2017/020582, dated Jan. 25, 2018, 6 pages.
International Preliminary Report on Patentability for PCT/US2017/020582, dated May 23, 2018, 23 pages.

* cited by examiner

| Command | CS | CA0 | CA1 | CA2 | CA3 | CA4 | CA5 | CK |
|---|---|---|---|---|---|---|---|---|
| WRITE | H | L | L | H | BA0 | BA1 | BA2 | R1 |
|  | L | C4 | C5 | C6 | C7 | C8 | C9 | R2 |
| READ | H | L | H | L | BA0 | BA1 | BA2 | R1 |
|  | L | C4 | C5 | C6 | C7 | C8 | C9 | R2 |
| CAS | H | L | L | L | V | V | V | R1 |
|  | H | LB-D0 | LB-D1 | UB-D0 | UB-D1 | V | V | R2 |

FIG. 12

| DQ Byte | Burst Cycle Number (Beat of Burst) | | | | | | | |
|---|---|---|---|---|---|---|---|---|
| | 1 | 2 | 3 | 4 | 5 | 6 | 7 | 8 |
| Reference Data S[7:0] through DQ0 | S0 | S1 | S2 | S3 | S4 | S5 | S6 | S7 |
| Original 64bit Data | | | | | | | | |
| DQ0 | D0 | D8 | D16 | D24 | D32 | D40 | D48 | D56 |
| DQ1 | D1 | D9 | D17 | D25 | D33 | D41 | D49 | D57 |
| DQ2 | D2 | D10 | D18 | D26 | D34 | D42 | D50 | D58 |
| DQ3 | D3 | D11 | D19 | D27 | D35 | D43 | D51 | D59 |
| DQ4 | D4 | D12 | D20 | D28 | D36 | D44 | D52 | D60 |
| DQ5 | D5 | D13 | D21 | D29 | D37 | D45 | D53 | D61 |
| DQ6 | D6 | D14 | D22 | D30 | D38 | D46 | D54 | D62 |
| DQ7 | D7 | D15 | D23 | D31 | D39 | D47 | D55 | D63 |

FIG. 13

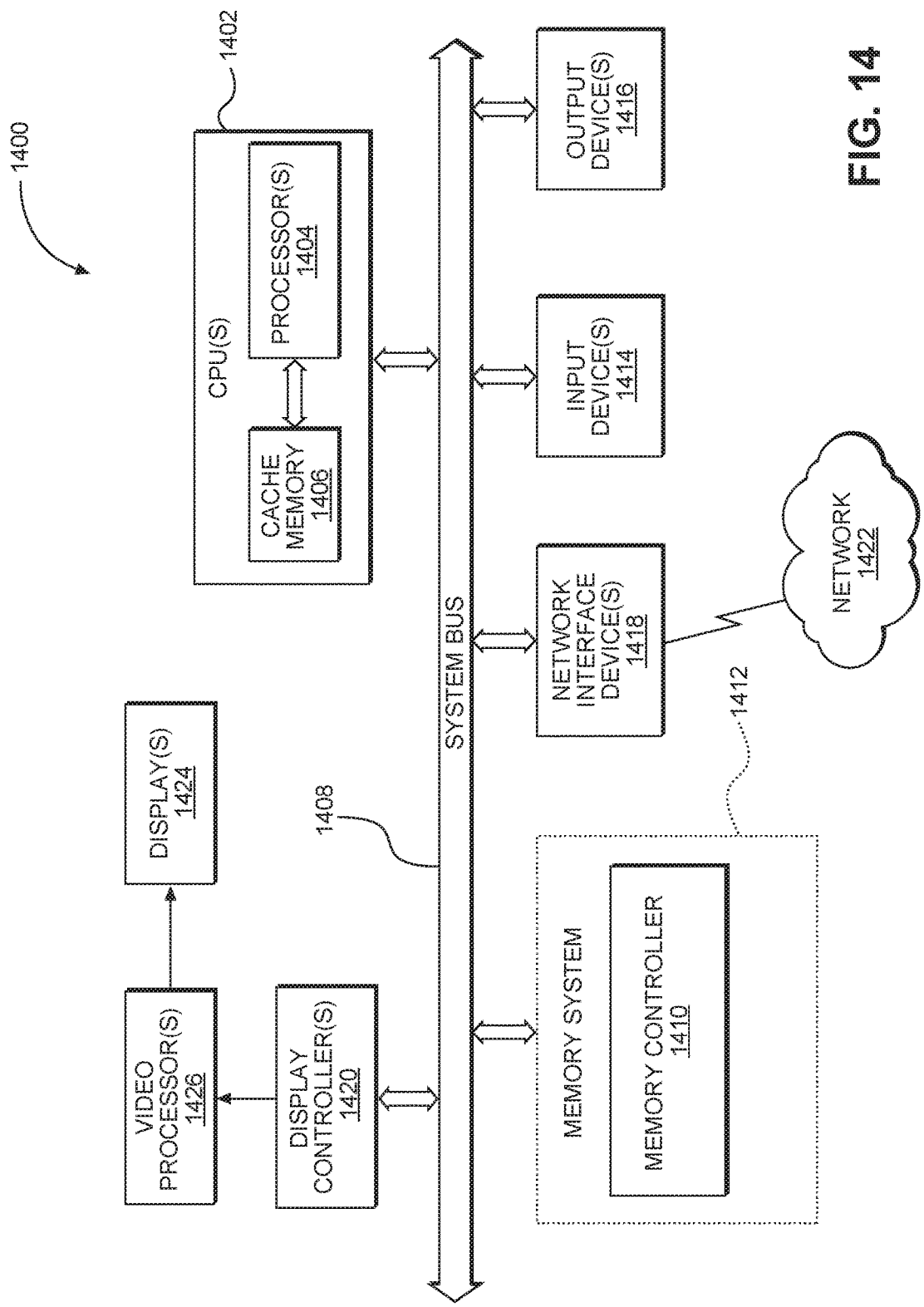

POWER SAVING TECHNIQUES FOR MEMORY SYSTEMS BY CONSOLIDATING DATA IN DATA LANES OF A MEMORY BUS

PRIORITY CLAIM

The present application claims priority to U.S. Provisional Patent Application Ser. No. 62/302,891 filed on Mar. 3, 2016 and entitled "POWER SAVING TECHNIQUES FOR MEMORY SYSTEMS," the contents of which is incorporated herein by reference in its entirety.

BACKGROUND

I. Field of the Disclosure

The technology of the disclosure relates generally to memory systems in computing devices and particularly to power saving techniques for memory systems.

II. Background

Computing devices have become common in current society. Mobile computing devices in particular have proliferated throughout many aspects of everyday life. Such mobile computing devices are powered by batteries that are periodically recharged. While advances in battery technology have increased the time that may pass before a battery needs to be recharged, such advances have been offset by the increasing functionality of mobile computing devices. That is, the additional functionality increases battery use, which in turn requires more frequent charging. Accordingly, pressure to decrease power consumption throughout the mobile computing device remains.

It should be appreciated that virtually all computing devices require memory elements of some sort to operate. While memory power consumption has been reduced by voltage scaling through successive iterations of low power double data rate (LPDDR) memory standards (e.g., LPDDR1 was set at 1.8 volts; LPDDR2 and LPDDR3 were set at 1.2 volts; and LPDDR4 was set at 1.1 volts), voltage scaling seems to have reached a plateau given current technology constraints. In particular, refresh limitations and other circuit performance issues necessitate the 1.1 volts of LPDDR4. The next generation of low-power memory (i.e., LPDDR5) is currently being debated, and LPDDR5 contemplates lowering the voltage to 1.05 volts, but this reduction offers only marginal power savings.

While power savings may be of particular interest in mobile computing devices, non-mobile devices may also benefit from reduced power consumption to reduce waste heat generation. Thus, computing devices of various sorts may benefit from memory systems that have decreased power consumption.

SUMMARY OF THE DISCLOSURE

Aspects disclosed in the detailed description include power saving techniques for memory systems. In particular, exemplary aspects of the present disclosure contemplate taking advantage of patterns that may exist within memory elements and eliminating duplicative data transfers. Specifically, if data is repetitive, instead of sending the same data repeatedly, the data may be sent only a single time with instructions that cause the data to be replicated at a receiving end to restore the data to its original repeated state. By reducing the amount of data that is transferred between a host and a memory element, power consumption is reduced.

In this regard in one aspect, a host processor is disclosed. The host processor includes a physical layer (PHY) interface configured to be coupled to a plurality of data lanes of a memory bus. The host processor also includes a memory controller coupled to the PHY interface. The memory controller includes a data pattern checker logic circuit. The memory controller is configured to use the data pattern checker logic circuit to determine if patterns of repeatable data exist in data to be written to a memory element over the memory bus. The memory controller is also configured to consolidate the data into fewer lanes and send the data across only certain ones of the plurality of data lanes of the memory bus.

In another aspect, a memory system is disclosed. The memory system includes an input/output (IO) block configured to be coupled to a memory bus. The memory system also includes a memory bank including memory elements. The memory bank is communicatively coupled to the IO block. The memory system also includes a write register operative to receive data from the memory bus through the IO block and duplicate the data a number of times according to a command from a host processor.

In another aspect, a host processor is disclosed. The host processor includes a PHY interface configured to be coupled to a plurality of data lanes of a memory bus. The host processor also includes a read register. The host processor also includes a memory controller coupled to the PHY interface. The memory controller is configured to receive data through the PHY interface from a memory system. The memory controller is also configured to cause data within the read register to be duplicated based on information received from the memory system.

In another aspect, a memory system is disclosed. The memory system includes an IO block configured to be coupled to a memory bus. The memory system also includes a memory bank including memory elements. The memory bank is communicatively coupled to the IO block. The memory bank is configured to respond to a read command by sending consolidated data over the memory bus to host processor.

In another aspect, an apparatus is disclosed. The apparatus includes a host processor including a memory controller and a PHY interface. The apparatus also includes a memory system. The apparatus also includes a memory bus. The host processor sends data to be written into the memory system via the PHY interface and the memory bus. The memory controller includes a data pattern checker logic circuit. The memory controller is operative to use the data pattern checker logic circuit to determine if patterns of repeatable data exist in the data to be written into the memory system over the memory bus. The memory controller is also operative to consolidate the data to reduce data sent over the memory bus.

In another aspect, an apparatus is disclosed. The apparatus includes a host processor including a memory controller and a PHY interface. The apparatus also includes a memory system. The apparatus also includes a memory bus. The host processor receives data read from the memory system via the PHY interface and the memory bus. The memory system is operative to determine if patterns of repeatable data exist in the data being read from the memory system and consolidate the data to reduce data sent over the memory bus in response to a read command from the host processor.

BRIEF DESCRIPTION OF THE FIGURES

FIG. 2A is an exemplary image of code stored within a memory element;

FIG. 2B is an exemplary image of uncompressed data stored within a memory element;

FIGS. 3B-3D are exemplary data flows between a host processor and a memory system according to exemplary aspects of the present disclosure;

FIG. 12 illustrates an exemplary write and read command truth table;

FIG. 13 is a data flow that shows an alternate way to consolidate data between data lanes; and FIG. 14 is a block diagram of an exemplary processor-based system that can include the host processor and the memory systems of FIGS. 4-6.

DETAILED DESCRIPTION

Figure 1:
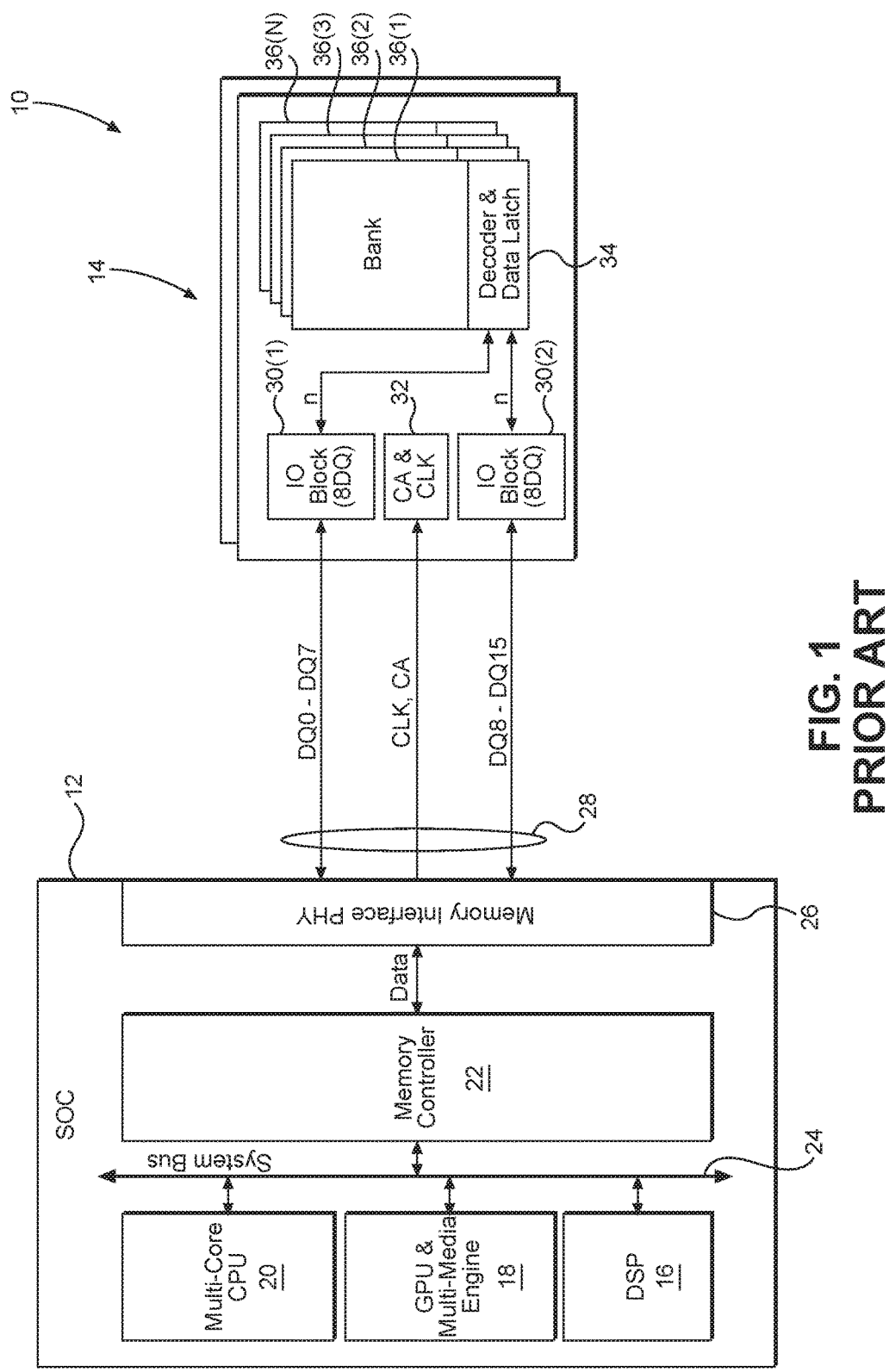
FIG. 1 is a simplified block diagram of an exemplary conventional computing device having a host processor and a memory system.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include power saving techniques for memory systems. In particular, exemplary aspects of the present disclosure contemplate taking advantage of patterns that may exist within memory elements and eliminating duplicative data transfers. Specifically, if data is repetitive, instead of sending the same data repeatedly, the data may be sent only a single time with instructions that cause the data to be replicated at a receiving end to restore the data to its original repeated state. By reducing the amount of data that is transferred between a host and a memory element, power consumption is reduced.

Before addressing particular aspects of the present disclosure, an overview of a conventional computing device with a host processor and a memory system is discussed with a discussion of repeated data and its power consumption impact illustrated by FIGS. 1-3A. The discussion of exemplary aspects of the present disclosure begins below with reference to FIG. 3B.

In this regard, FIG. 1 is a simplified block diagram of a conventional computing device 10 having a host processor 12 and a memory system 14. The host processor 12 may be a system on a chip (SoC) or combination of integrated circuits (ICs) to achieve the same functionality. In particular, the host processor 12 may include a digital signal processor (DSP) 16, a graphic processing unit (GPU) and multi-media engine 18, a multi-core central processing unit (CPU) 20, and a memory controller 22. The DSP 16, the GPU and multi-media engine 18, the multi-core CPU 20, and the memory controller 22 may communicate with one another over a system bus 24. The memory controller 22 may work with a memory interface physical layer (PHY) 26 to couple to a memory bus 28. The memory bus 28 also couples to the memory system 14. In an exemplary aspect, the memory bus 28 includes a first eight data lanes (sometimes called DQ0-DQ7), a clock (referenced in drawings as CLK), command, and address lane (sometimes the command and address lanes are denoted CA), and a second eight data lanes (sometimes called DQ8-DQ15). Note that the clock, command, and address lane may be three separate lanes, two lanes (e.g., clock on one, command and address on the other), or a single lane as needed or desired. As used herein, a lane is a physical conductor (e.g., a wire trace). Typically, each lane has its own pin associated with the memory interface PHY 26 on the host processor 12 and a respective pin for the memory system 14.

With continued reference to FIG. 1, the memory system 14 may include one or more data lane input/output (IO) blocks such as data lane IO blocks 30(1)-30(2) and a command/address/clock (referenced in drawings as CA & CLK) block 32. Further, the memory system 14 may include a decoder and data latch 34 for each memory bank of memory banks 36(1)-36(N) (four shown). While the term "block" is used, it should be appreciated that a block in this context is a logic circuit or other hardware element as is well understood.

Figure 2A:
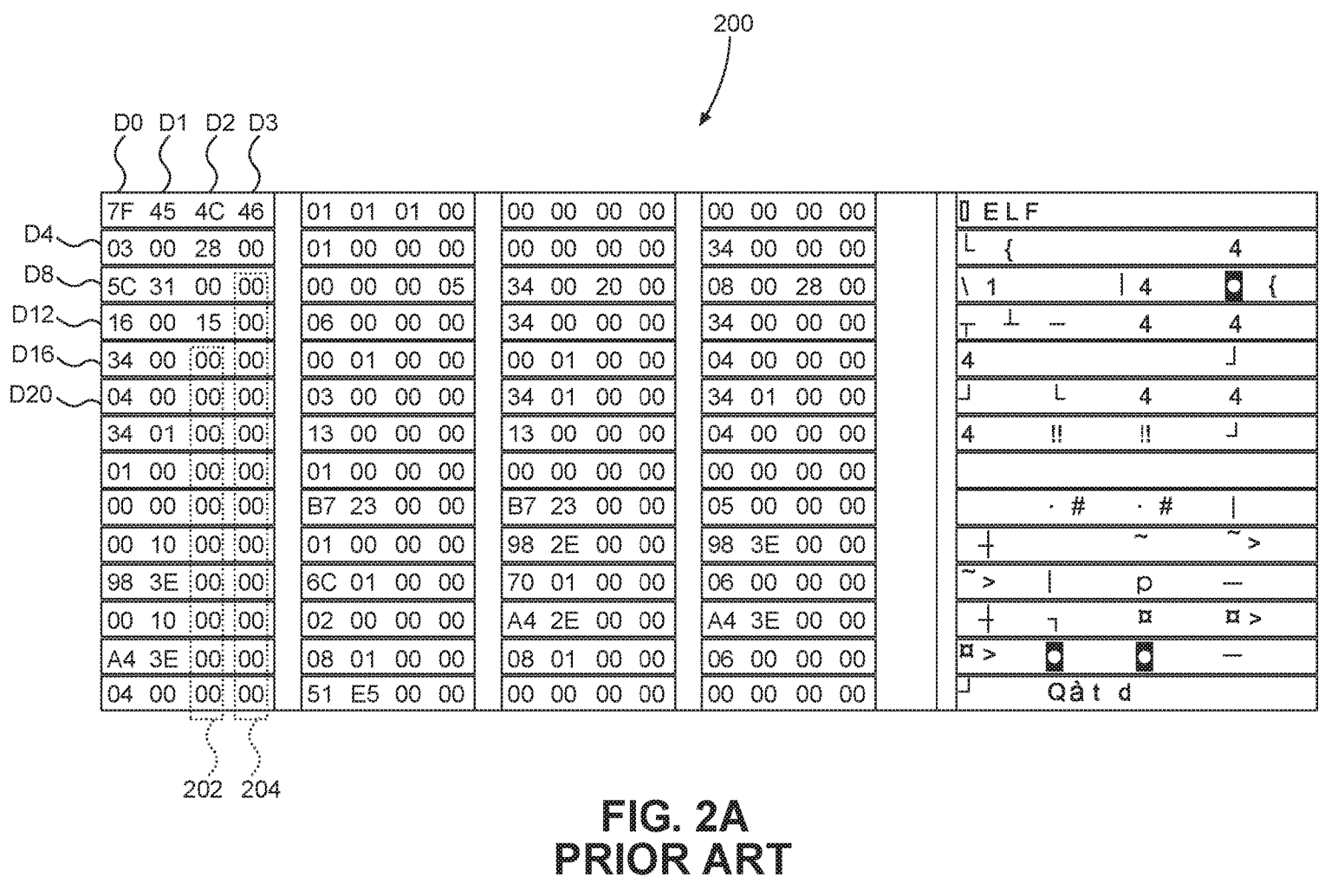
Figure 2B:
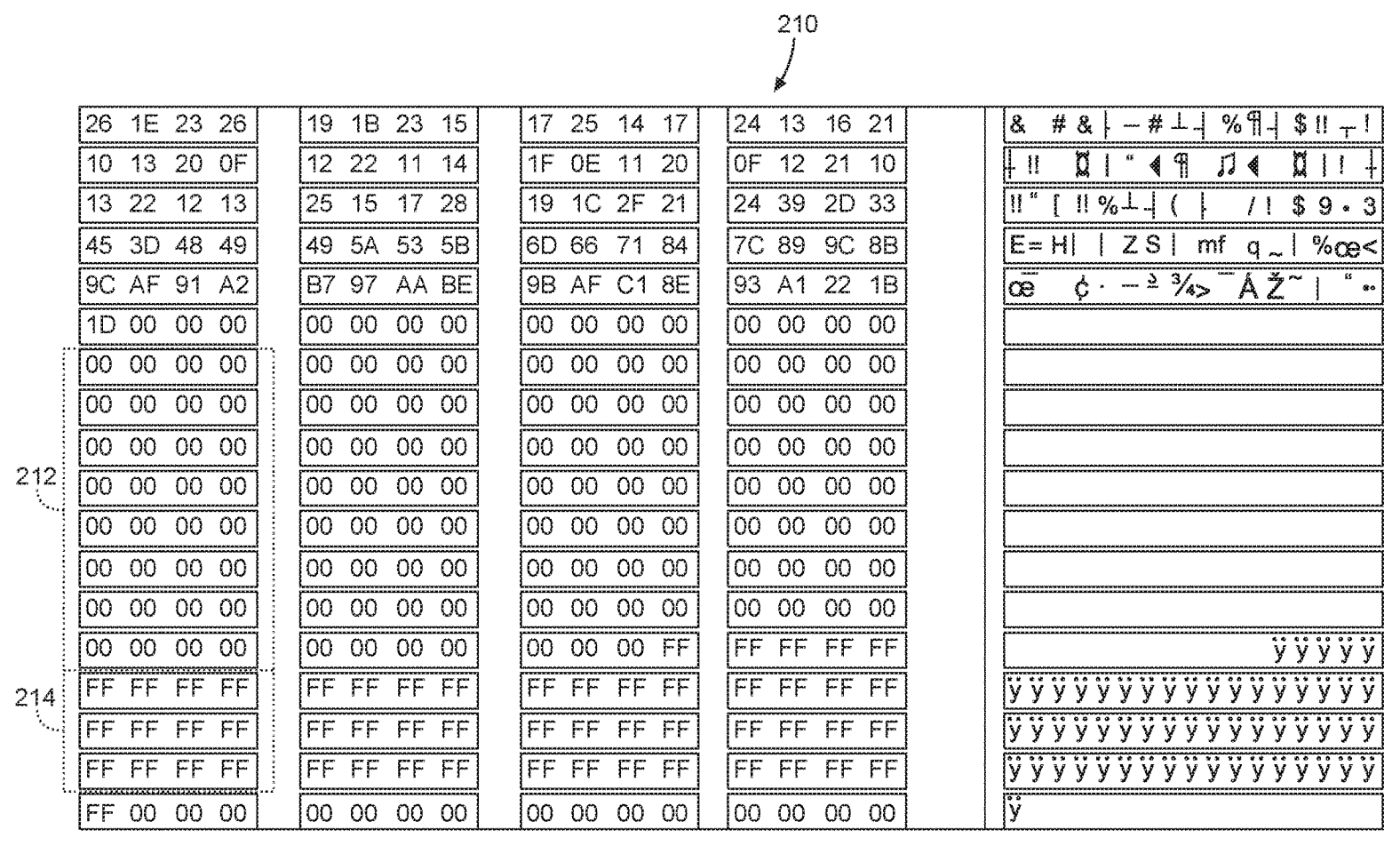

As is also well understood, the host processor 12 reads from the memory system 14 and writes to the memory system 14. In many instances, the read/write activity relates to data, but in some instances the read/write activity relates to code. In either case, the content stored within the memory banks 36(1)-36(N) is frequently duplicative. While the code generally only takes up about ten percent of the memory banks 36(1)-36(N), the code is frequently duplicative. An exemplary code snippet 200 is illustrated in FIG. 2A. As is readily apparent, the code snippet 200 includes repeated content, which, in this example, is "00" (see generally areas 202 and 204 within the code snippet 200). Likewise, the data may consume the remaining portion of the memory banks 36(1)-36(N), but the data likewise is frequently duplicative. An exemplary data block 210 is illustrated in FIG. 2B. As is readily apparent, the data block 210 includes repeated "00" (see, for example, area 212) and repeated "FF" (see, for example, area 214). While the data and the code are conceptually different, as used herein, "data" will refer to content that resides within, is being written to, and is being read from the memory banks 36(1)-36(N). Likewise, it should be appreciated that while the exemplary repeated content is "00" or "FF", actual data may include other repeated content and/or change the frequency of the repetition.

Figure 3A:
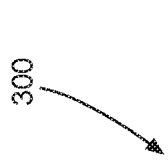
FIG. 3A is an exemplary data flow across eight data lanes between a host processor and a memory system without the benefit of the present disclosure.

In conventional systems, such as the computing device 10 of FIG. 1, when a read or write command is performed, the data of the read or write command is distributed across the data lanes (i.e., D0-D15) and sent to a receiving entity (i.e., the host processor 12 if a read command or the memory system 14 if a write command). This arrangement is illustrated in FIG. 3A, where a data burst 300 is illustrated. The data burst 300 corresponds to the content of FIG. 2A, and each of the slots (D0-D127) in the first eight data lanes DQ0-DQ7 is populated with corresponding data (only illustrated through D39). As is readily apparent, in many instances, many of the data within the slots D0-D127 are duplicative. It should be appreciated that power consumption across the memory bus 28 is a function of data speed and amount of data. Thus, sending duplicative data across the memory bus 28 consumes power.

Exemplary aspects of the present disclosure take advantage of the duplication of data in read and write commands and consolidate the duplicated data onto a single data lane before sending only a single copy of the duplicated data across the memory bus 28 instead of sending multiple copies across multiple data lanes. By reducing the amount of data sent across the memory bus 28, exemplary aspects of the present disclosure provide power savings even without being able to perform further voltage scaling. While this power saving may translate to longer battery life for mobile computing devices, it may also generate less waste heat in non-mobile devices, and any computing device may benefit from the present disclosure.

Figure 3B:
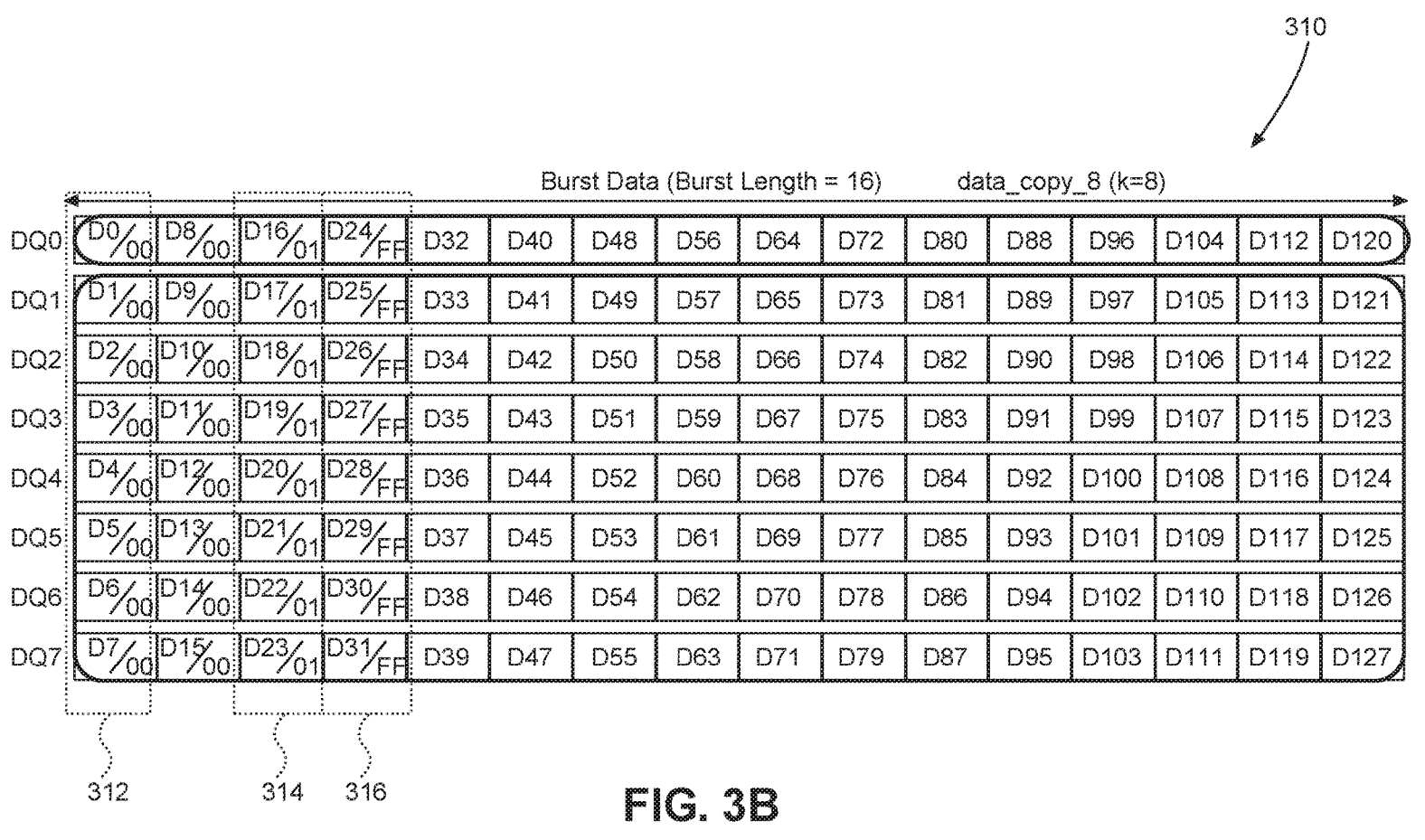

In this regard, FIG. 3B illustrates a first aspect where data within data block 310 is the same across eight slot groupings. For example, the data that would go into slots D0-D7 (see generally 312) is all "00;" the data that would go into slots D16-D23 (see generally 314) is all "01;" and the data that would go into slots D24-D31 (see generally 316) is all "FF." However, rather than sending the same data eight times (once across each data lane DQ0-DQ7), the data is sent only on data lane DQ0 and data lanes DQ1-DQ7 are turned off. That is, instead of sending, for example, "00" on the data lanes DQ0-DQ7 in slots D8-D15, only the data lane DQ0 sends slot D8 with an instruction that the data for the data lanes DQ1-DQ7 are the same as the slot D8. At the receiving end, a receiver receives the slots from the data lane DQ0 and duplicates the data therein to reconstruct the duplicated data.

Figure 3C:
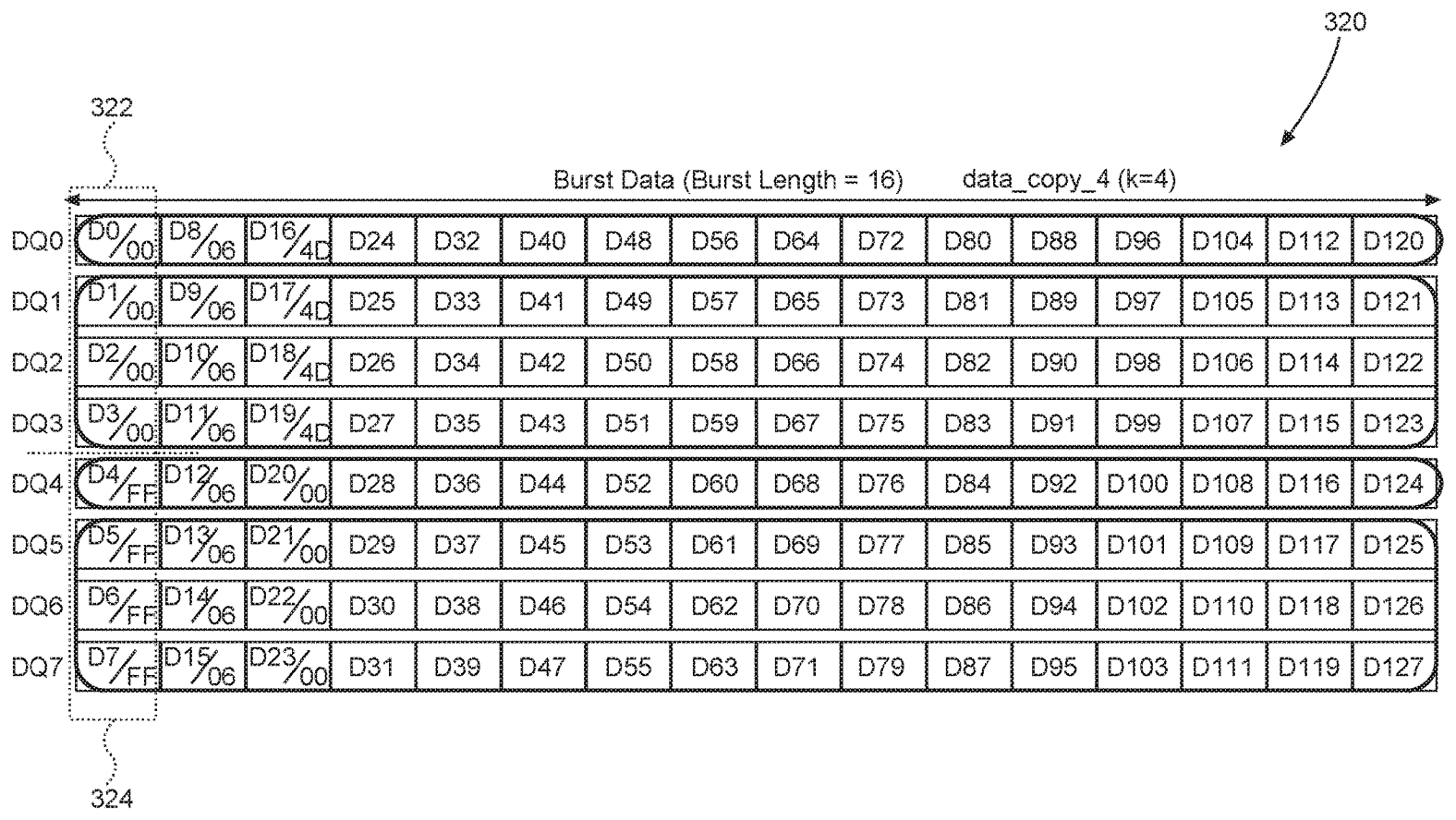

It should be appreciated that not every collection of data will have eight slots having the same data therein. Accordingly, FIG. 3C illustrates a situation where data block 320 has four slots that are the same. For example, the data within grouping 322 corresponding to slots D0-D3 are the same, and the data within grouping 324 corresponding to slots D4-D7 are the same, but not the same as the data within the grouping 322. Thus, data is sent on data lanes DQ0 and DQ4 and duplicative data lanes DQ1-DQ3 and DQ5-DQ7 are turned off. While having two active lanes consumes more power than having one active lane, having the two active lanes is still less power-consuming than having eight active lanes.

Figure 3D:
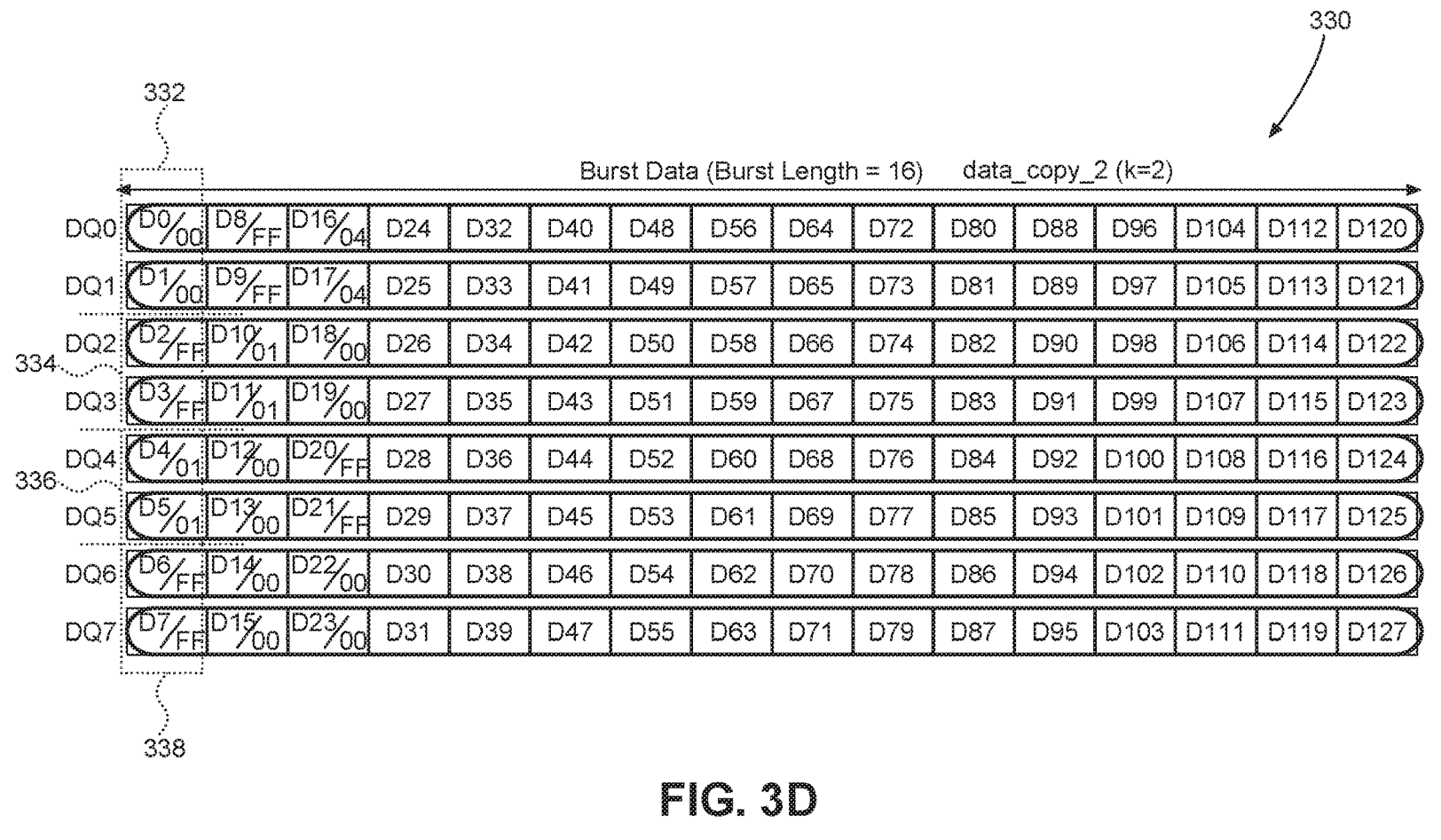

Likewise, FIG. 3D illustrates a situation where data block 330 has two slots that are the same. For example, the data within grouping 332 corresponding to slots D0-D1 are the same; the data within grouping 334 corresponding to slots D2-D3 are the same; the data within grouping 336 corresponding to slots D4-D5 are the same; and the data within grouping 338 corresponding to slots D6-D7 are the same. Thus, data is sent on data lanes DQ0, DQ2, DQ4, and DQ6 and data lanes DQ1, DQ3, DQ5, and DQ7 are turned off. Again, while having four active lanes consumes more power than having one or two active lanes, having the four active lanes is still less power consuming than having eight active lanes. Separate pattern checking can be used for the data that is being sent over data lanes DQ8-DQ15.

To communicate that the duplicate data techniques of the present disclosure are being used, modified read and write commands may be used. For example, if only one data lane is being used with seven duplicates, the commands may be RD_X1 and WR_X1. If two data lanes are being used with three duplicates for each data lane, then the commands may be RD_X2 and WR_X2. Likewise, if four data lanes are being used with one duplicate per lane, the commands may be RD_X4 and WR_X4. It should be appreciated that this nomenclature is arbitrary and used for illustrative purposes. In practice, the read and write commands may be modified by a column address select (CAS) command. The data within the CAS command can encode how a read or write command is modified (e.g., modify a read command to RD_X1, RD_X2, or RD_X4). The CAS command relative to the read or write command is explored in greater detail below with reference to FIG. 11. While use of the CAS command is one way to signal the modified read and write commands, other techniques may be used without departing from the scope of the present disclosure.

Figure 4:
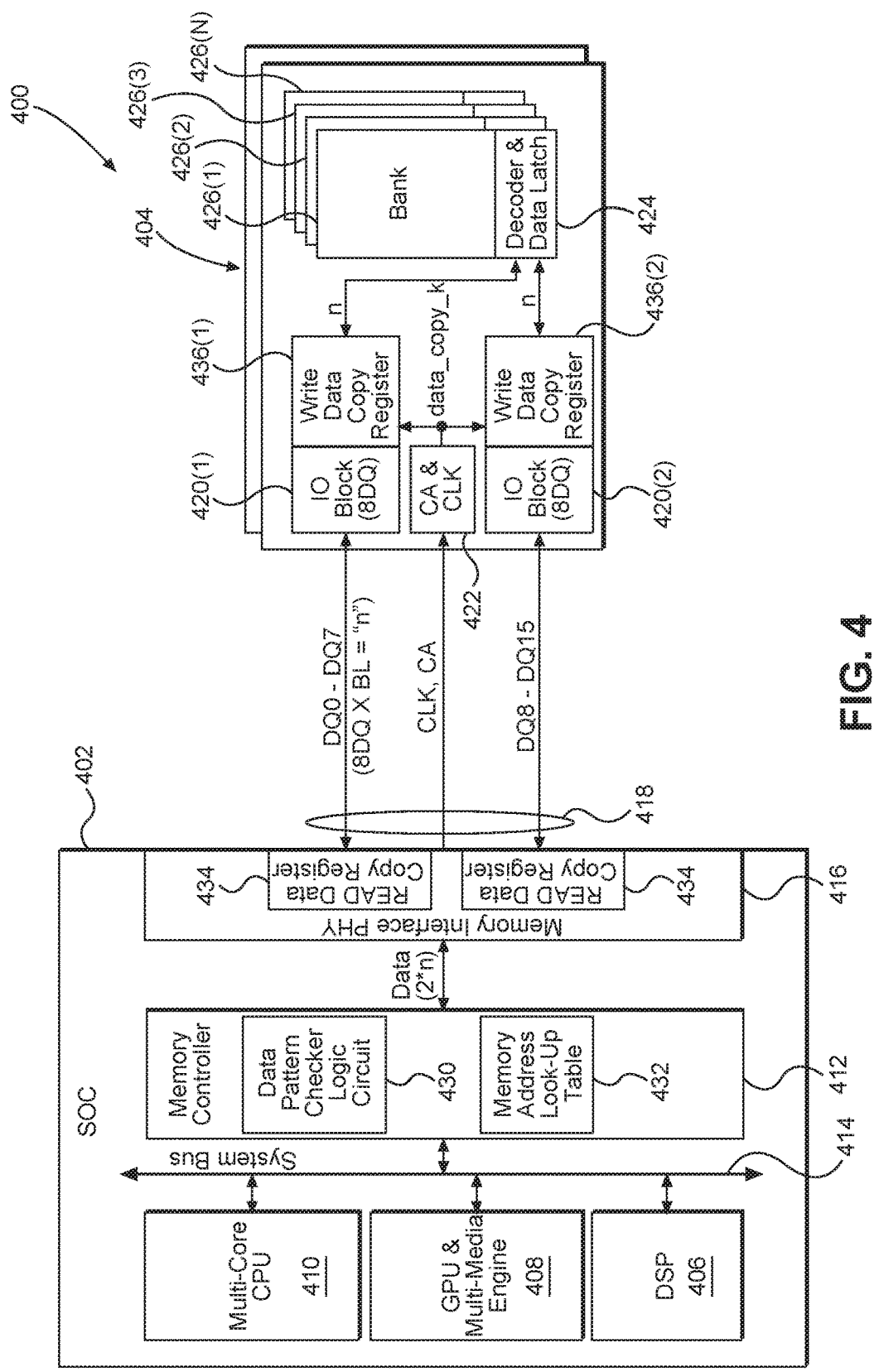
FIG. 4 is a simplified block diagram of an exemplary computing device having a host processor and a memory system according to an exemplary aspect of the present disclosure.
Figure 5:
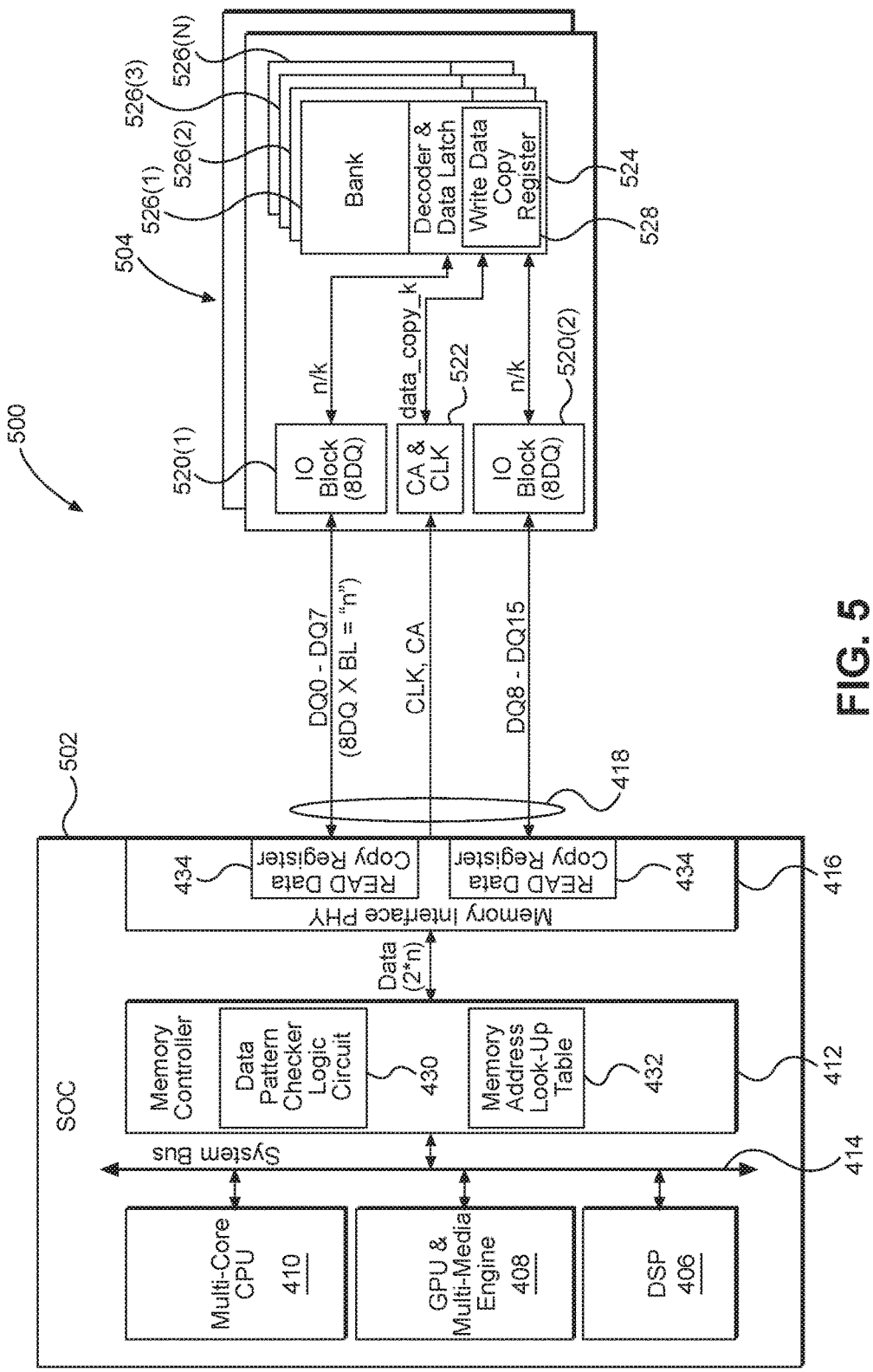
FIG. 5 is a simplified block diagram of an exemplary computing device having a host processor and a memory system according to a second exemplary aspect of the present disclosure.
Figure 6:
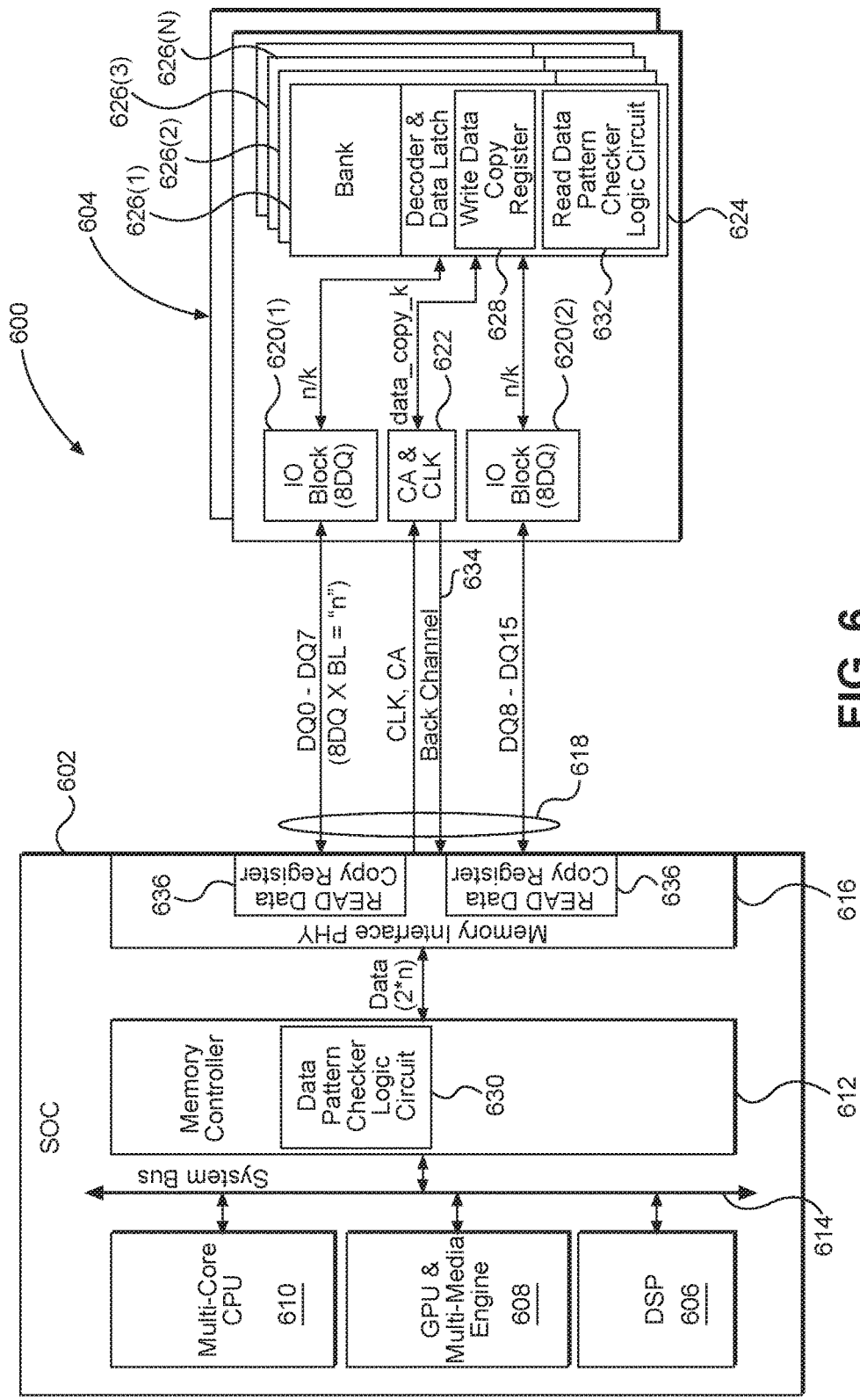
FIG. 6 is a simplified block diagram of an exemplary computing device having a host processor and a memory system according to a third exemplary aspect of the present disclosure.

To effectuate the consolidation of duplicate data lanes, certain modifications to the computing device 10 of FIG. 1 must be made that allow detection of duplicate data and copying of the duplicate data into the slots that would have been populated by inactive data lanes. FIGS. 4-6 illustrate exemplary alternate ways in which these modifications may be implemented. In this regard, FIG. 4 illustrates an exemplary computing device 400 having a host processor 402 and a memory system 404. The host processor 402 may be a robust SoC or a combination of ICs to achieve the same functionality. In particular, the host processor 402 may include a DSP 406, a GPU and multi-media engine 408, a multi-core CPU 410, and a memory controller 412. The DSP 406, the GPU and multi-media engine 408, the multi-core CPU 410, and the memory controller 412 may communicate with one another over a system bus 414. The memory controller 412 may work with a memory interface PHY 416 to couple to a memory bus 418 that also couples to the memory system 404. In an exemplary aspect, the memory bus 418 includes a first eight data lanes (sometimes called DQ0-DQ7), a clock (sometimes called CLK), command, and address lane (sometimes called CA), and a second eight data lanes (sometimes called DQ8-DQ15). Note that the clock, command, and address lane may be three separate lanes, two lanes (clock on one, command and address on the other), or a single lane as needed or desired. Additionally, there may be further backchannel lanes (not specifically illustrated). As noted above, each lane is typically associated with its own physical pin and is a physical conductor.

With continued reference to FIG. 4, the memory system 404 may include one or more data lane IO blocks such as data lane IO blocks 420(1)-420(2) and a command/address/clock block 422. Further, the memory system 404 may include a decoder and data latch 424 for each memory bank of memory banks 426(1)-426(N) (four shown).

With continued reference to FIG. 4, the memory controller 412 may include a data pattern checker logic circuit 430 and a memory address look-up table 432. Likewise, the memory interface PHY 416 may include one or more read data copy registers 434. One of the one or more read data copy registers 434 may be associated with each bundle of data lanes (DQ0-DQ7 or DQ8-DQ15). The memory system 404 includes write data copy registers 436(1)-436(2) associated with the respective data lane IO blocks 420(1)-420(2). An output from the command/address/clock block 422 is provided to each of the write data copy registers 436(1)-436(2). Based on a command received (e.g., WR_X1, WR_X2, or WR_X4), the command is passed to the write data copy registers 436(1)-436(2) and causes them to duplicate data before passing the entire data set to each decoder and data latch 424 for writing into the memory banks 426(1)-426(N).

When data is being written to the memory system 404, the data pattern checker logic circuit 430 checks to see if the data is repeated in a particular pattern and, if so, may cause the data to be collapsed onto fewer lanes with an appropriate write command (e.g., WR_X1, WR_X2, or WR_X4) instead of sending the duplicative data over all eight data lanes. Simultaneously, an indication of the duplicate data is stored in the memory address look-up table 432. At the memory system 404, the write data copy registers 436(1)-436(2) take the received data and duplicate the received data to recreate the original eight slots of data such that the recreated data consumes the appropriate number of memory slots based on the commands received from the command/address/clock block 422. The expanded data is written to the memory banks 426(1)-426(N).

When a read command is generated, the host processor 402 may reference the memory address look-up table 432 to see if there is duplicate data. If there is duplicate data, an appropriate read command (e.g., RD_X1, RD_X2, or RD_X4) is sent to the memory system 404. The memory system 404 then sends only the collapsed data across the active lanes on the memory bus 418. The one or more read data copy registers 434 then take the collapsed data and duplicate the collapsed data the appropriate number of times to recreate the original data.

As a side note, without using aspects of the present disclosure, the memory controller 22 of FIG. 1 may generate 2*n bits of data. Each bundle of data lanes (DQ0-DQ7 and DQ8-DQ15) receives n bits of data and spreads the n bits of data across the data lanes sequentially until a beat length (BL) is complete. Thus, 8DQ*BL=n. Each of the data lane IO blocks 30(1)-30(2) sends the n bits of data to the decoder and data latch 34 for storage in the memory banks 36(1)-36(N). In contrast, in the computing device 400 of FIG. 4, the same 2*n data may be passed to the memory interface PHY 416, but only n/8, n/4, or n/2 bits of data is sent over a particular grouping of data lanes (depending on whether WR_X1, WR_X2, or WR_X4 is used as the write command). The write data copy registers 436(1)-436(2) expand the consolidated data back to n bits of data based on a command (data_copy_k, where k is the inverse of the consolidation (i.e., k is eight (8) for WR_X1, k is four (4) for WR_X2 and k is two (2) for WR_X4)) from the command/address/clock block 422 before passing the n bits to the decoder and data latch 424. Note that if data consolidation does not occur in the computing device 400 (e.g., because the data is not repetitive), then the computing device 400 may still function in a fashion similar to the computing device 10 by sending 2*n data over the full eight lanes.

Instead of placing the write data copy registers 436(1)-436(2) in conjunction with the data lane IO blocks 420(1)-420(2), a write data copy register may be placed in each decoder and data latch of the memory system of the computing device. This exemplary aspect is illustrated in FIG. 5. Specifically, an exemplary computing device 500 is illustrated having a host processor 502 identical to the host processor 402 of FIG. 4. Likewise, the host processor 502 is coupled to the memory bus 418. In place of the memory system 404, the computing device 500 includes a memory system 504.

With continued reference to FIG. 5, the memory system 504 may include one or more data lane IO blocks such as data lane IO blocks 520(1)-520(2) and a command/address/clock block 522. Further, the memory system 504 may include a decoder and data latch 524 for each memory bank of memory banks 526(1)-526(N) (four shown).

The command/address/clock block 522 provides a command to a write data copy register 528. Note that this aspect may provide further power savings since less data (n/k bits of data) is conveyed between the data lane IO blocks 520(1)-520(2) and each decoder and data latch 524. Since less data is conveyed over these internal buses, less power is consumed. Thus, in contrast to the memory system 404 of FIG. 4, the memory system 504 only conveys n/k bits of data to the memory banks 526(1)-526(N) and each internal write data copy register 528 receives the data_copy_k command and expands the data back to the original 2*n bits of data.

It should be appreciated that the memory address look-up table 432 is a relatively expensive piece of hardware and has limited address space considering the real silicon implementation. Accordingly, as a further exemplary aspect, an exemplary computing device 600, illustrated in FIG. 6, eliminates the memory address look-up table and places a read data pattern checker logic circuit in each decoder and data latch along with a write data copy register in the memory system. In this regard, FIG. 6 illustrates the computing device 600 having a host processor 602 and a memory system 604. The host processor 602 may be a robust SoC or a combination of ICs to achieve the same functionality. In particular, the host processor 602 may include a DSP 606, a GPU and multimedia engine 608, a multi-core CPU 610, and a memory controller 612. The DSP 606, the GPU and multi-media engine 608, the multi-core CPU 610, and the memory controller 612 may communicate with one another over a system bus 614. The memory controller 612 may work with a memory interface PHY 616 to couple to a memory bus 618 that also couples to the memory system 604. In an exemplary aspect, the memory bus 618 includes a first eight data lanes (sometimes called DQ0-DQ7), a clock (sometimes called CLK), command, and address lane (sometimes called CA), and a second eight data lanes (sometimes called DQ8-DQ15). Note that the clock, command, and address lane may be three separate lanes, two lanes (clock on one, command and address on the other), or a single lane as needed or desired. Additionally, there may be further backchannel lane(s) 634. As noted above, each lane is typically associated with its own physical pin and is a physical conductor.

With continued reference to FIG. 6, the memory system 604 may include one or more data lane IO blocks such as data lane IO blocks 620(1)-620(2) and a command/address/clock block 622. Further, the memory system 604 may include a decoder and data latch 624 for each memory bank of memory banks 626(1)-626(N) (four shown).

When data is being written to the memory system 604, a data pattern checker logic circuit 630 within the memory controller 612 checks to see if the data is repeated in a particular pattern and, if so, may cause the data to be collapsed onto fewer lanes with an appropriate write command (e.g., WR_X1, WR_X2, or WR_X4) instead of sending the duplicative data over all eight data lanes. Write data copy register 628 receives the data_copy_k command and expands the data back to the original 2*n bits of data.

In this exemplary aspect, the host processor 602 does not store the patterns in a memory address look-up table because there is no memory address look-up table. However, write commands (WR_X1, WR_X2, WR_X4) are issued as previously discussed. Read commands always begin as normal read commands without any request to collapse or consolidate duplicated data. However, the memory system 604, on receiving a read command, uses a read data pattern checker logic circuit 632 to see if there are instances of duplicated data that can be consolidated as described above. If there are, the read data pattern checker logic circuit 632 informs the command/address/clock block 622, which indicates that the response to the read command will be in the form of consolidated data through a backchannel lane 634 on the memory bus 618. Thus, the memory system 604 includes a backchannel output (not labeled) that allows information about the consolidated data to be sent to the host processor 602. The host processor 602, and specifically the one or more read data copy registers 636, then duplicates the received data to recreate the original data.

Figure 7:
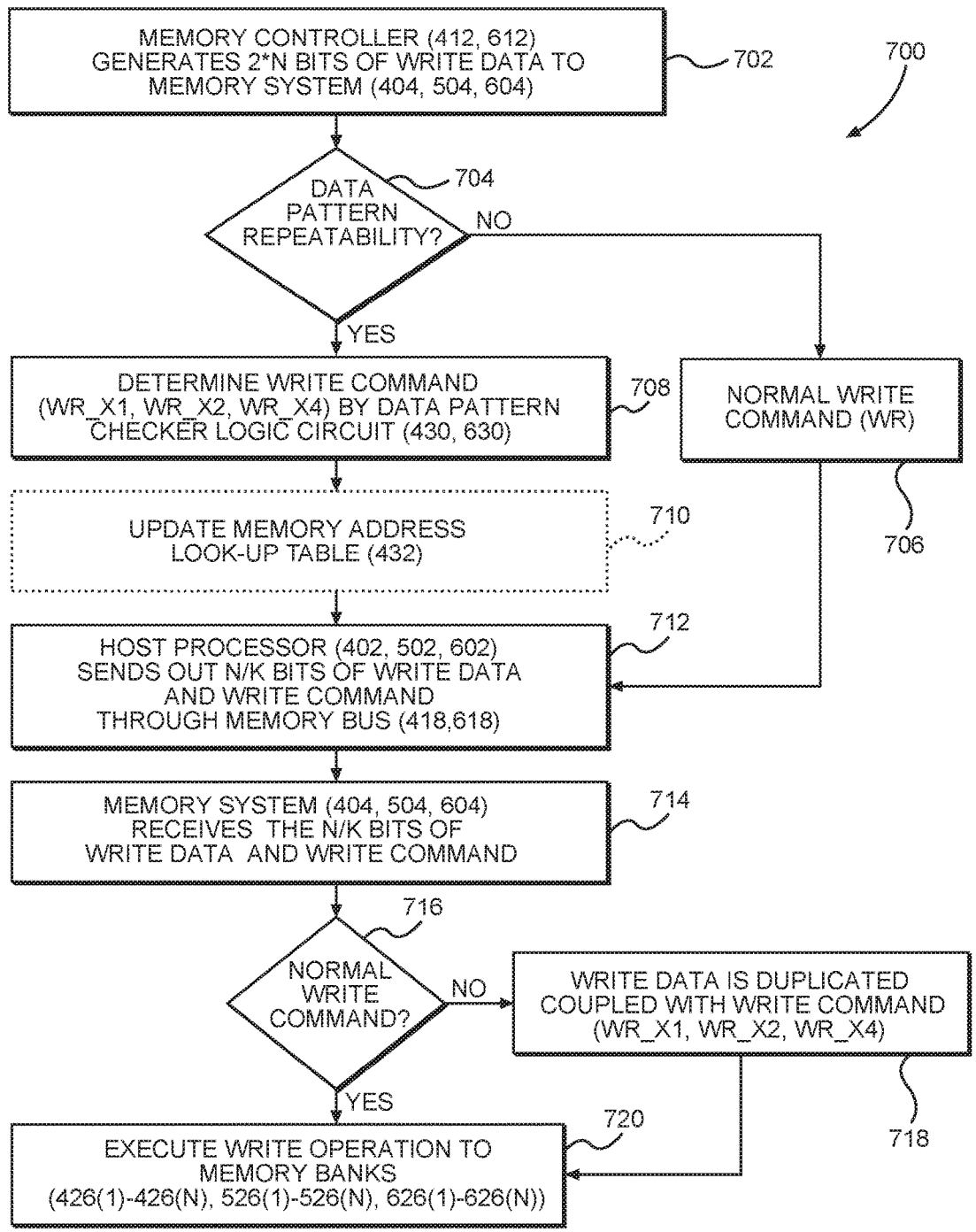
FIG. 7 is a flowchart illustrating a write process according to an exemplary aspect of the present disclosure.

Against the backdrop of the hardware described above with reference to FIGS. 4-6, FIGS. 7 and 8 provide flowcharts of exemplary processes that implement exemplary aspects of the present disclosure. In this regard, FIG. 7 is a flowchart of a write operation process 700 according to an exemplary aspect of the present disclosure. The write operation process 700 begins with the memory controller 412, or 612 generating 2*n bits of write data to be written to the memory system 404, 504, or 604 (block 702). The data pattern checker logic circuit 430 or 630 checks for data pattern repeatability (block 704). If the answer to block 704 is no, there is not data pattern repeatability, then the memory controller 412 or 612 issues a normal write command (block 706).

With continued reference to FIG. 7, if the answer to block 704 is yes, there is data pattern repeatability, then the data pattern checker logic circuit 430 or 630 determines which write command is appropriate given the patterns detected (e.g., WR_X1, WR_X2, or WR_X4) (block 708). If the memory address look-up table 432 is present, the memory controller 412 updates the memory address look-up table 432 (block 710). The host processor 402, 502, or 602 then sends out n/k bits of the write data and the appropriate write command (WR_X1, WR_X2, or WR_X4, in which case k is eight (8), four (4), or two (2), respectively) through the memory bus 418 or 618 (block 712). Thus, exemplary aspects of the present disclosure allow for the data to be sent across only certain ones of the data lanes of the memory bus 418 or 618. It should be appreciated that as used herein, "certain ones" includes the use of just one data lane. Note that if a normal write command is used, k equals one (1) (i.e., n bits of the write data are sent). The memory system 404, 504, or 604 receives the n/k bits of the write data and the write command (block 714). The command/address/clock block 422, 522, or 62 determines if the write command is a normal write command (block 716). If the answer to block 716 is no, then the write data copy registers 436(1)-436(2), 528, or 628 duplicate the write data until the original data is restored (block 718). If however a normal write command is determined at block 716 (or after the duplication of block 718), the memory system 404, 504, or 604 executes the write operation into the memory banks 426(1)-426(N), 526(1)-526(N) or 626(1)-626(N) (block 720).

Figure 8:
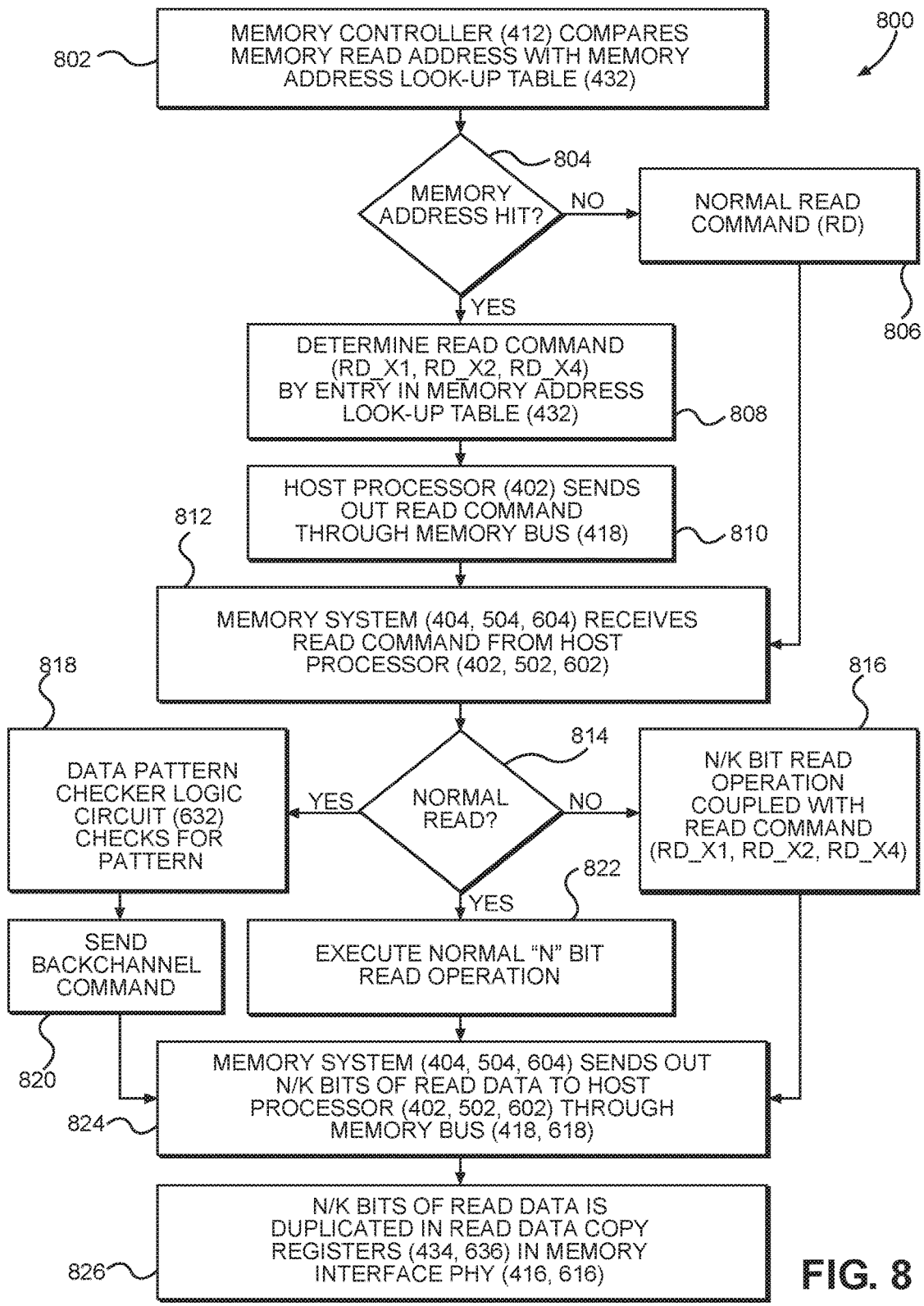
FIG. 8 is a flowchart illustrating a read process according to an exemplary aspect of the present disclosure.

Similarly, FIG. 8 illustrates a flowchart of a read operation process 800. The read operation process 800 begins with the memory controller 412 (or 612) determining that data is needed from the memory system 404 or 504. The memory controller 412 compares a memory read address with the memory address look-up table 432 (block 802) to see if there is a memory address hit (block 804). If there is not a hit at block 804, then a normal read command is sent (block 806). Note that in the computing device 600, where there is no memory address look-up table 432, a normal read command is sent in block 806. If however, there is a memory address hit at block 804 (i.e., there is an entry in the memory address look-up table 432 corresponding to the memory read address), then, based on the entry in the memory address look-up table 432, the memory controller 412 determines an appropriate read command (i.e., RD_X1, RD_X2, or RD_X4) (block 808). The host processor 402 then sends out the appropriate read command through the memory bus 418 (block 810). The memory system 404, 504, or 604 receives the read command from the host processor 402, 502, or 602 (block 812).

With continued reference to FIG. 8, once the read command is received, the command/address/clock block 422, 522, or 622 determines if the read command is a normal read command (block 814). If the answer to block 814 is no, it is not a normal read command (i.e., RD_X1, RD_X2, or RD_X4), then the decoder and data latch 424 or 524 retrieves n/k bits from the memory banks 426(1)-426(N) or 526(1)-526(N) (block 816). Note that for the computing device 600, even if the answer to block 814 is yes, then the read data pattern checker logic circuit 632 checks for patterns (block 818) and determines what amount of consolidation is possible. The memory system 604 sends a backchannel command (block 820) over the backchannel lane 634 indicating that a consolidated read data set is being sent to the host processor 602. Otherwise, if the read command is a normal read command, then the decoder and data latch 424, 524, or 624 executes a normal n bit read operation (block 822). After block 816, 820 or 822, the memory system 404, 504, or 604 sends out n/k bits of read data to the host processor 402, 502, or 602 through the memory bus 418 or 618 (block 824). The n/k bits of the read data is then duplicated as needed by the one or more read data copy registers 434 or 636 in the memory interface PHY 416 or 616 (block 826) and used as needed.

Figure 9:
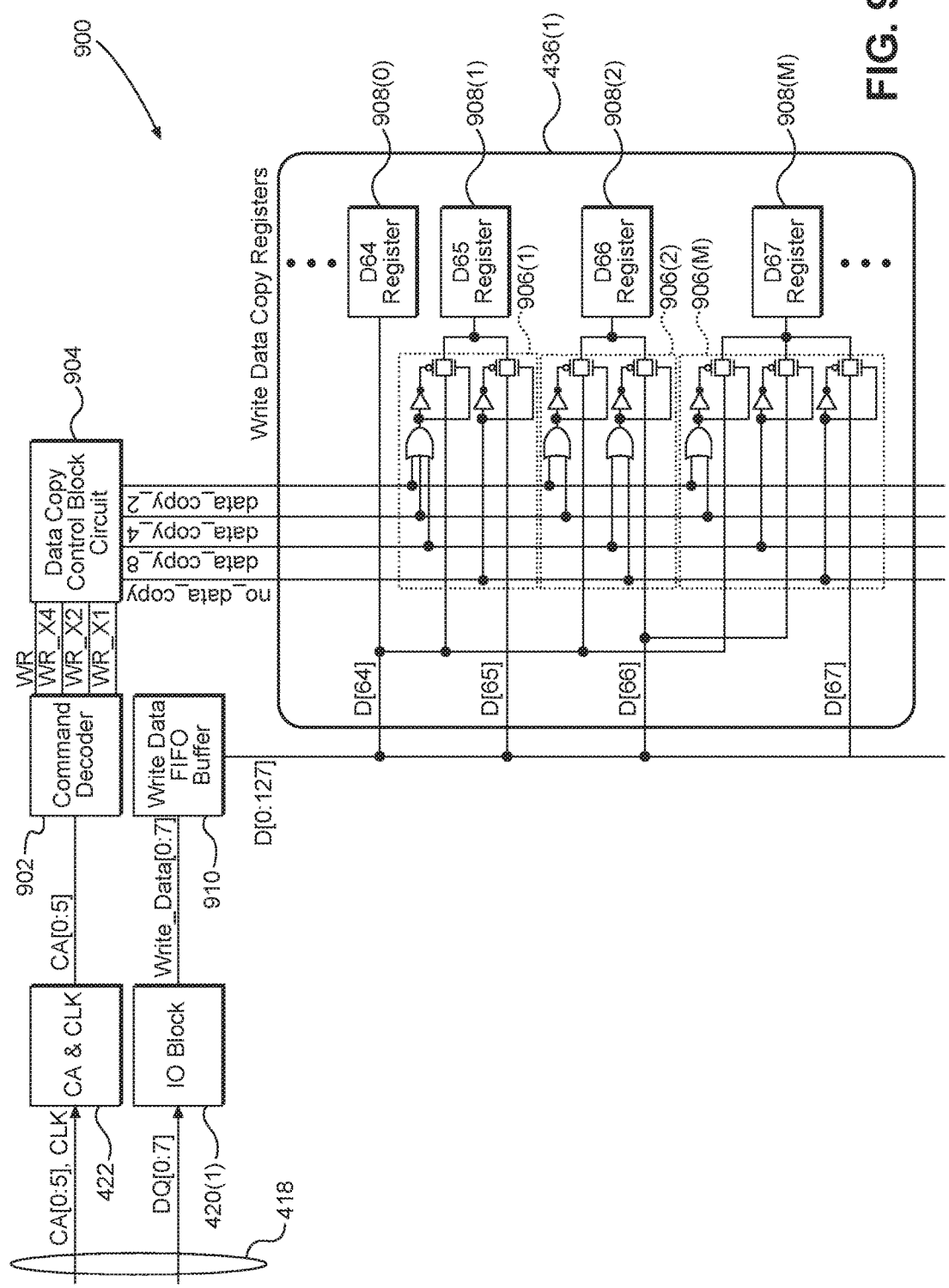
FIG. 9 illustrates a simplified block diagram of a write path circuit in a memory system.

FIG. 9 illustrates an exemplary write data path 900 within the memory system 404 of FIG. 4, the memory system 504 of FIG. 5, or the memory system 604 of FIG. 6. However, for the purposes of the illustration, it is assumed that the write data path 900 is in the memory system 404. Thus, data lanes DQ0-DQ7 and the CA lanes arrive through the memory bus 418. While not illustrated, data lanes DQ8-DQ15 may also be present in the memory bus 418. The CA lanes pass to the command/address/clock block 422, while the data lanes DQ0-DQ7 are coupled to data lane IO block 420(1). The instructions and commands in the CA lanes are passed to a command decoder 902, which determines if a normal write command or WR_X1, WR_X2, or WR_X4 has been issued by the host processor 402. Based on the received command, the command decoder 902 instructs a data copy control block circuit 904. The data copy control block circuit 904 controls gating logic circuits 906(1)-906(M) associated with registers 908(0)-908(M) within write data copy register 436(1). Concurrently, a write data first in first out (FIFO) buffer 910 provides the n bits of data as data input to the write data copy register 436(1).

As illustrated in FIG. 9, the n bits of data would normally go to the M registers of the registers 908(0)-908(M). When the data copy control block circuit 904, asserts no_data_copy, then one data bit to one of the registers 908(1)-908(M) is what occurs. However, if the data copy control block circuit 904 asserts one of the data_copy_8, data_copy_4, or data_copy_2 lines, then the gating logic circuits 906(0)-906(M) operate to cause the data to be copied into a respective number of the registers 908(0)-908(M). It should be appreciated that other structures may be used for the write data path 900 without departing from the scope of the present disclosure.

Figure 10:
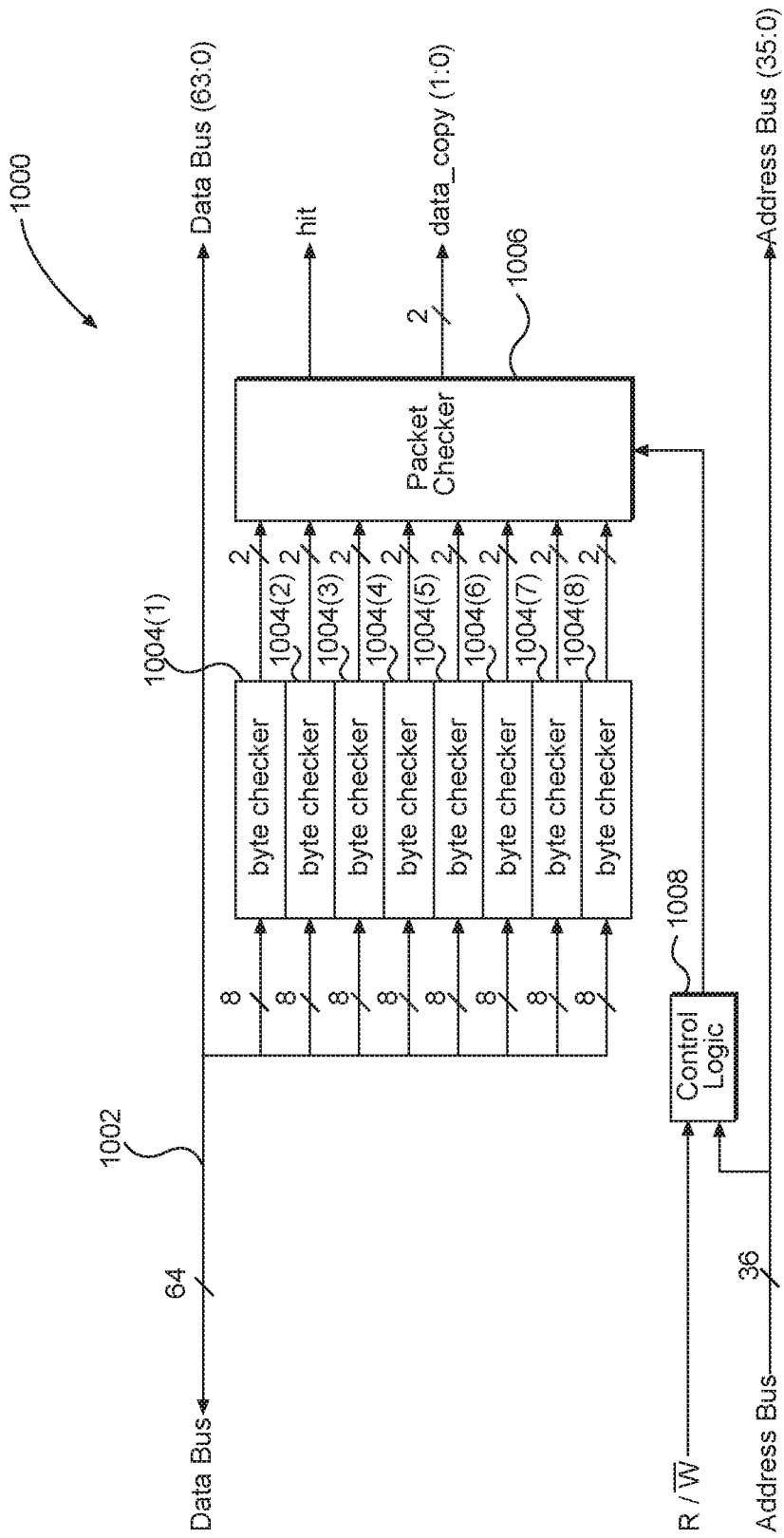
FIG. 10 illustrates a simplified block diagram of a data pattern checker logic circuit in a memory controller.

FIG. 10 illustrates an exemplary block diagram of a data pattern checker logic circuit 1000, corresponding to the data pattern checker logic circuit 430 or 630 of FIG. 4 or 6. The data pattern checker logic circuit 1000 includes a data bus 1002 that carries, for example, 64 bits of data thereon. These 64 bits of data are provided to byte checkers 1004(1)-1004(8). As illustrated, eight bits, corresponding to one bit for each of the data lanes DQ0-DQ7, are provided to each of the byte checkers 1004(1)-1004(8). The byte checkers 1004(1)-1004(8) output, for example, a two-bit code indicating a match of zero bits, two bits, four bits, or eight bits, corresponding to a normal write, WR_X4, WR_X2, or WR_X1, respectively. These two-bit codes are provided to a packet checker 1006. The packet checker 1006 compares all outputs for the entire packet to determine a minimum value of data to propagate. If a minimum match is not made, then a false result is returned, which means that there is no consolidation of data. If a positive result is returned, then a transaction start address will be stored in the memory address look-up table 432 of FIG. 4, if present. A control logic 1008 keeps track of transaction start and end. The packet checker 1006 outputs a hit signal and a data_copy (1:0) to the memory interface PHY 416 or 616. These signals will go to a command and address encoding block (not shown) in the memory interface PHY 416 or 616. The address bus (35:0) is also sent to the command and address encoding block. The command and address encoding block uses the signals to construct an appropriate command with an appropriate address to send over the memory bus 418 or 618 to the memory system 404, 504, or 604. The data bus 63:0 is the data that is sent to the memory interface PHY 416 or 616 and consolidated (or not) as appropriate before sending to the memory system 404, 504, or 604.

Figure 11:
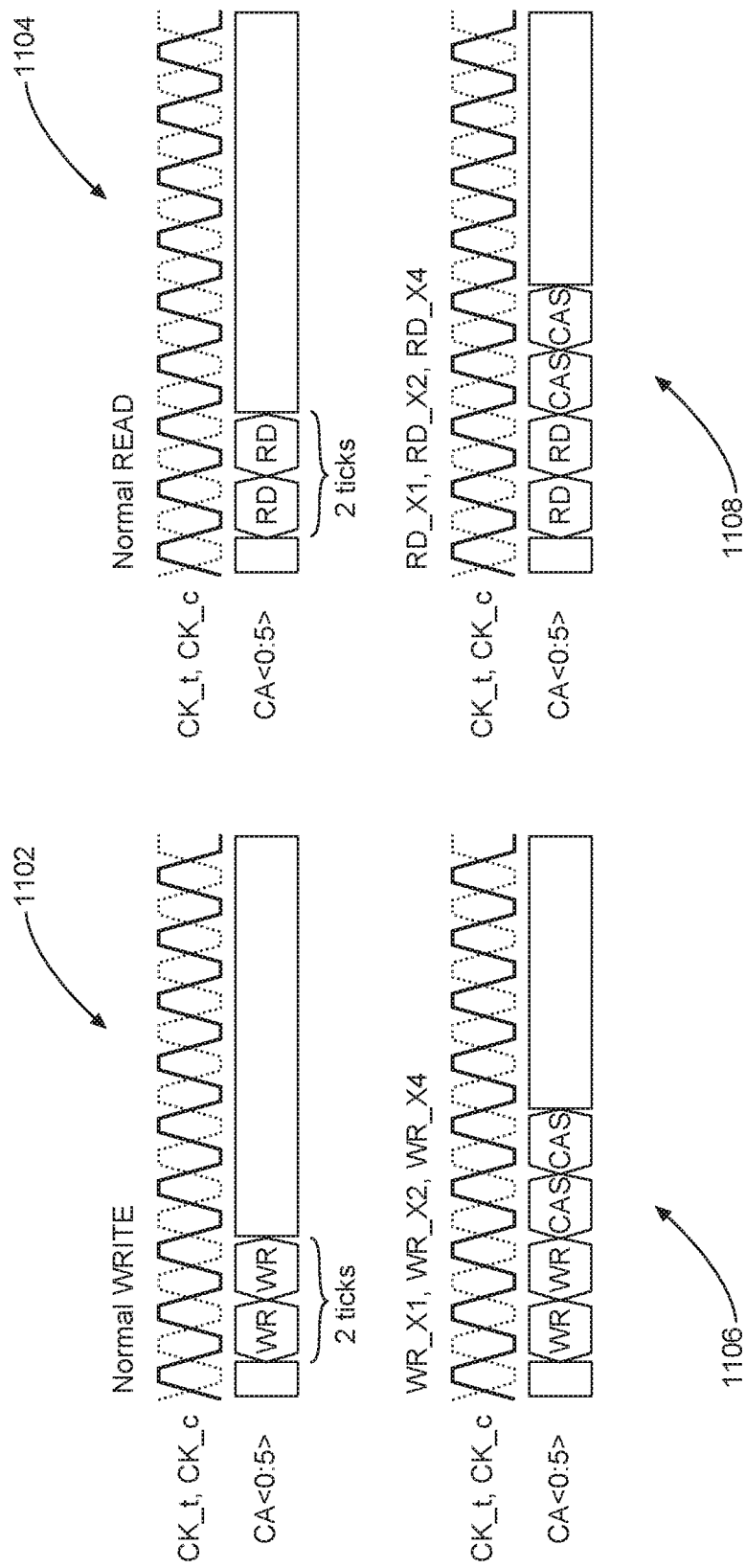
FIG. 11 illustrates read and write commands with timing relative to a clock on a bus.

FIG. 11 illustrates exemplary write and read command address bus timing. As is readily apparent, a normal write command 1102 and a normal read command 1104 take two clock ticks. The modified commands of the present disclosure modify the read and write commands with a CAS command. To get a two-bit CAS command and the two-bit read or write command take four ticks total. Thus, as illustrated, a modified write command 1106 is presented as WR, WR, CAS, CAS, and a modified read command 1108 is presented as RD, RD, CAS, CAS. However, the net reduction in data sent over the memory bus 418 still reduces power even though the commands use slightly more bits. It should be appreciated that the modified write command 1106 and the modified read command 1108 are illustrative, and alternate commands could be used. Likewise, the CAS command can be positioned in front of the write or read commands without departing from the scope of the present disclosure. Note further, instead of using a modified read command, the host processor 602 may send a normal read command and the memory system 604 uses the backchannel lane 634 to indicate to the host processor 602 that consolidated data is being sent to the host processor 602. While the backchannel lane 634 is illustrated as extending from the command/address/clock block 622, it should be appreciated that other backchannels could be used. For example, the backchannel could be an additional DQ lane from a data lane IO block (e.g., data lane IO block 620(1) or 620(2)).

FIG. 12 is an exemplary write and read command truth table. The Command bus consists of Chip Select (CS) and 6 lanes of a Command Address bus (CA0-CA5). Normal write and read command protocol (command code, Bank Address (BA), Column Address (C4-C9)) is transferred over two clock ticks. In case of reduced IO lane write and read, write and read commands may be modified by a CAS command to inform the type of reduced IO lane command (WR_X1 or WR_X2 or WR_X4 for a write command, RD_X1 or RD_X2 or RD_X4 for a read command) like the modified commands 1106 and 1108 illustrated in FIG. 11. The CAS command includes a command code and reduced IO per DQ byte (LB-D0, LB-D1 for lower DQ byte (DQ0-DQ7), UB-D0, UB-D1 for upper DQ byte (DQ8-DQ15)). For example, when (LB-D0, LB-D1)=00 and (UB-D0, UB-D1)=10 for the write and CAS commands, memory systems interpret a normal write for the lower DQ byte and a reduced IO lane write (WR_X1 for example) for the upper DQ byte. Still other truth tables may be constructed to effectuate exemplary aspects of the present disclosure.

Note further, that instead of (or in addition to) indicating a difference between different write commands, the CAS command can be used to indicate for how long data consolidation occurs out of a larger write command. For example, the data consolidation may occur for the first or second eight beats of a sixteen BL or the first, second, third, or fourth eight beats of a thirty-two BL.

Likewise, it should be appreciated that the use of the backchannel lane 634 may allow elimination of the modified read command 1108. In an exemplary aspect, the backchannel lane 634 may be a data mask (DM) lane. A DM lane may be associated with the data lane IO blocks 620(1) and 620(2). Normally, if the DM beat is "H," the corresponding DQ byte is not written to the memory array, but traditionally, the DM lane is only used during write commands. Thus, the DM lane is open for use during responses to read commands. In such instance, when a particular DM lane is asserted, that indicates that data consolidation is occurring in response to the read command Note that while the above discussion has contemplated data consolidation based on vertical repetition within the data being transferred, the present disclosure is not so limited. In this regard, FIG. 13 illustrates a situation where every eighth bit is repeated. Data consolidation may still occur in such instance, where the first repeat bit is mapped to D0, D8, D16, D24, etc., the second repeated bit is mapped to D1, D9, D17, D25, etc. and so on. However, the repeated bits are only sent on data lane DQ0, resulting in power savings as outlined above.

The power saving techniques for memory systems according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

In this regard, FIG. 14 illustrates an example of a processor-based system 1400 that can employ the host processors 402, 502, and 602 and the memory systems 404, 504, and 604 illustrated in FIGS. 4-6. In this example, the processor-based system 1400 includes one or more CPUs 1402, each including one or more processors 1404, which may be the host processor 402, 502, or 602. The CPU(s) 1402 may have cache memory 1406 coupled to the processor(s) 1404 for rapid access to temporarily stored data. The CPU(s) 1402 is coupled to a system bus 1408 and can intercouple devices included in the processor-based system 1400. The system bus 1408 may be the system bus 414 or 614. As is well known, the CPU(s) 1402 communicates with these other devices by exchanging address, control, and data information over the system bus 1408. For example, the CPU(s) 1402 can communicate bus transaction requests to a memory controller 1410, which may be the memory controller 412 or 612. Although not illustrated in FIG. 14, multiple system buses 1408 could be provided.

Other devices can be connected to the system bus 1408. As illustrated in FIG. 14, these devices can include a memory system 1412, which may be the memory system 404, 504, or 604, one or more input devices 1414, one or more output devices 1416, one or more network interface devices 1418, and one or more display controllers 1420, as examples. The input device(s) 1414 can include any type of input device, including, but not limited to, input keys, switches, voice processors, etc. The output device(s) 1416 can include any type of output device, including, but not limited to, audio, video, other visual indicators, etc. The network interface device(s) 1418 can be any device configured to allow exchange of data to and from a network 1422. The network 1422 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1418 can be configured to support any type of communications protocol desired.

The CPU(s) 1402 may also be configured to access the display controller(s) 1420 over the system bus 1408 to control information sent to one or more displays 1424. The display controller(s) 1420 sends information to the display(s) 1424 to be displayed via one or more video processors 1426, which process the information to be displayed into a format suitable for the display(s) 1424. The display(s) 1424 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a DSP, an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An apparatus, comprising:
 a host processor, the host processor comprising:
  a physical layer (PHY) interface configured to be coupled to a plurality of data lanes of a memory bus;
  a read register; and a memory controller coupled to the PHY interface, the memory controller comprising a data pattern checker logic circuit, wherein the memory controller is configured to:
  use the data pattern checker logic circuit to determine if patterns of repeatable data exist in data to be written to a memory element over the memory bus; and
  consolidate the data and send the data across only certain ones of the plurality of data lanes of the memory bus using a write command modified by a column address select (CAS) command, wherein the CAS command informs the memory system how to duplicate the data.

2. The apparatus of claim 1, wherein the memory controller further comprises a look-up table and the memory controller writes to the look-up table address information for data written to the memory element.

3. The apparatus of claim 2, wherein the memory controller is configured to use the look-up table to determine if data being read from the memory element has the patterns of repeatable data such that a consolidated read command may be used.

4. The apparatus of claim 1, wherein the memory controller is configured to consolidate duplicated data from eight lanes onto one data lane.

5. The apparatus of claim 1, wherein the memory controller is configured to consolidate duplicated data from eight lanes onto two or four data lanes.

6. The apparatus of claim 1, wherein the CAS command is configured to encode how the write command is modified from a normal write command to a reduced lane write command.

7. The apparatus host processor of claim 1 integrated into an integrated circuit (IC).

8. The apparatus of claim 1, wherein the memory controller is configured to consolidate duplicated data from eight lanes onto one data lane.

9. The apparatus of claim 1, wherein the memory controller is configured to cause the data within the read register to be duplicated based on information received through a datamask (DM) lane.

10. The apparatus of claim 1, wherein the memory controller is configured to cause the data within the read register to be duplicated based on information received through a backchannel lane of the memory bus.

11. The apparatus of claim 1, further comprising the memory element.

12. The apparatus of claim 11, wherein the apparatus comprises a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter, wherein the device incorporates the host processor and the memory element.

13. An apparatus comprising:
a memory system comprising:
  an input/output (IO) block configured to be coupled to a memory bus;
  a memory bank comprising memory elements, the memory bank communicatively coupled to the IO block; and
  a write register operative to receive data from the memory bus through the IO block and duplicate the data a number of times according to a write command modified by a column address select (CAS) command from a host processor, wherein the CAS command informs the memory system how to duplicate the data.

14. The apparatus of claim 13, wherein the memory bank is configured to store the duplicated data from the write register in the memory elements.

15. The apparatus of claim 13, further comprising a data pattern checker logic circuit associated with the memory bank.

16. The apparatus of claim 15, wherein the data pattern checker logic circuit is configured to determine if patterns of repeatable data exist in data read from the memory elements and consolidate the data and send the data across only certain ones of a plurality of data lanes of the memory bus.

17. The apparatus of claim 13, wherein the memory system is configured to duplicate the data from one lane eight times.

18. The apparatus of claim 13, wherein
  the memory bank is configured to respond to a read command modified by a column address select (CAS) command by sending consolidated data over the memory bus to a host processor.

19. The apparatus of claim 13, wherein the apparatus comprises a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter, wherein the device incorporates the host processor and the memory element.

20. An apparatus comprising:
a host processor comprising a memory controller and a physical layer (PHY) interface;
a memory system; and
a memory bus, wherein the host processor sends data to be written into the memory system via the PHY interface and the memory bus, and
wherein the memory controller comprises a data pattern checker logic circuit, and is operative to:
  use the data pattern checker logic circuit to determine if patterns of repeatable data exist in the data to be written into the memory system over the memory bus; and
  consolidate the data to reduce data sent over the memory bus using a write command modified by a column address select (CAS) command, wherein the write command modified by the CAS command informs the memory system how to duplicate the data.

21. The apparatus of claim 20, wherein the memory controller further comprises a look-up table and the memory controller writes to the look-up table address information for data written into the memory system.

22. The apparatus of claim 20, wherein the memory controller is configured to consolidate duplicated data from eight lanes onto one data lane, two data lanes, or four data lanes.

23. The apparatus of claim 20, wherein the memory controller is further operative to provide an indication to the memory system that the data sent over the memory bus will be consolidated data.

24. The apparatus of claim 20 wherein the apparatus comprises a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

25. A host processor comprising:
a physical layer (PHY) interface configured to be coupled to a plurality of data lanes of a memory bus; and
a memory controller coupled to the PHY interface, the memory controller comprising a data pattern checker logic circuit, wherein the memory controller is configured to:
use the data pattern checker logic circuit to determine if patterns of repeatable data exist in data to be written to a memory element over the memory bus; and
consolidate the data and send the data across only certain ones of the plurality of data lanes of the memory bus using a write command modified by a column address select (CAS) command, wherein data within the CAS command encodes how to duplicate the data.

26. A host processor comprising:
a physical layer (PHY) interface configured to be coupled to a plurality of data lanes of a memory bus; and
a memory controller coupled to the PHY interface, the memory controller comprising a data pattern checker logic circuit, wherein the memory controller is configured to:
use the data pattern checker logic circuit to determine if patterns of repeatable data exist in data to be written to a memory element over the memory bus; and
consolidate the data and send the data across only certain ones of the plurality of data lanes of the memory bus using a write command modified by a column address select (CAS) command, wherein the write command modified by the CAS command informs the memory controller how to duplicate the data.

* * * * *